United States Patent
Ishii et al.

(10) Patent No.: US 9,318,361 B2
(45) Date of Patent: Apr. 19, 2016

(54) COLLET CLEANING METHOD AND DIE BONDER USING THE SAME

(71) Applicant: Fasford Technology Co., Ltd., Minami-Alps, Yamanashi (JP)

(72) Inventors: Yoshihide Ishii, Tokyo (JP); Hiroshi Maki, Tokyo (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 0 days.

(21) Appl. No.: 14/104,705

(22) Filed: Dec. 12, 2013

(65) Prior Publication Data

US 2014/0251535 A1    Sep. 11, 2014

(30) Foreign Application Priority Data

Mar. 11, 2013  (JP) ................................ 2013-048328

(51) Int. Cl.
*F04B 47/00* (2006.01)
*H01L 21/67* (2006.01)

(52) U.S. Cl.
CPC .... *H01L 21/67132* (2013.01); *H01L 21/67028* (2013.01); *Y10T 156/15* (2015.01)

(58) Field of Classification Search
CPC ............... H01L 21/02041; H01L 21/02043; H01L 21/02057; H01L 21/67028; H01L 21/67132; Y10T 156/14; Y10T 156/15
USPC ........................... 134/6, 2, 137; 156/281, 536
See application file for complete search history.

(56) References Cited

U.S. PATENT DOCUMENTS

| 2006/0260648 A1* | 11/2006 | Lin et al. ........................... 134/6 |
| 2011/0308738 A1 | 12/2011 | Maki et al. |
| 2012/0241096 A1* | 9/2012 | Yamagami et al. ........... 156/535 |

FOREIGN PATENT DOCUMENTS

| JP | 6-302630 A | 10/1994 |
| JP | 2006-319298 A | 11/2006 |
| KR | 10-2012-0108896 A | 10/2012 |
| TW | 201201260 A | 1/2012 |

OTHER PUBLICATIONS

Korean Office Action dated Aug. 18, 2014 (six pages).
Taiwanese Office Action issued in corresponding Taiwanese Application No. 10421070970 dated Aug. 12, 2015 (six pages).

* cited by examiner

*Primary Examiner* — Jacob T Minskey
*Assistant Examiner* — Vishal I Patel
(74) *Attorney, Agent, or Firm* — Crowell & Moring LLP

(57) ABSTRACT

An object of the present invention is to provide a collet cleaning method and a die bonder using the same in which a collet can be cleaned without adding a new unit, and foreign substances with 5 high adhesive power can be reliably removed without scattering the foreign substances. A die bonder includes a pickup device, a bonding head unit having a collet that absorbs dies from a wafer at the timing of lifting of the pickup device, and a control unit that controls the pickup device 10 and the bonding head unit. The collet is moved to a position of a dicing tape at which no dies of the wafer held by a wafer ring exist to be brought into contact with the adhesive surface of the dicing tape, so that foreign substances attached to the tip end of the collet are removed.

5 Claims, 9 Drawing Sheets

COLLET CLEANING METHOD AND DIE BONDER USING THE SAME

BACKGROUND OF THE INVENTION

1. Field of the Invention

The present invention relates to a die bonder, and particularly to a method of removing foreign substances of a collet that picks up a die from a wafer.

2. Description of the Related Art

The die bonder is an apparatus that bonds (mounts and bonds) dies (chips of silicon substrates on which electric circuits are formed) to a lead frame or a substrate (hereinafter, referred to as a substrate) using solder, gold plating or resin as bonding material. It should be noted that an apparatus that actually performs bonding is provided in the subsequent process as an adhesive agent or the like is hardened depending on the type of the die bonder. Thus, "bonding" principally means "mounting" in the specification.

In a die bonding apparatus (die bonder) that mounts (bonds) a semiconductor chip called "die" on the surface of a substrate such as a printed circuit board or a lead frame, an operation (work) in which the semiconductor chip is carried onto the substrate using an absorption nozzle called "collet" to apply a pressing force, and bonding material is heated to perform bonding is repeated in general.

The collet is a retainer that has a hole in the middle and absorbs a die by sucking the air.

Using FIG. 9, an operation of a conventional die bonder will be described while focusing on a pickup operation in which dies are picked up from a wafer. FIG. 9 is a flowchart for explaining an embodiment of a procedure of a collet cleaning operation by a conventional die bonder. This operation is controlled in such a manner that a control unit of the die bonder mutually accesses the respective devices of the die bonder.

In a wafer setting step S11, a wafer configured using dies used for die bonding is set (supplied) to a pickup device.

Next, in an initial value setting step S12, the die bonder is initialized, map data for dies of the set wafer is written, and an implementation program for die bonding (mounting) of the dies on a desired substrate is written.

Next, in a die starting position reading step S13, a position (starting position) from which the dies are started to be picked up is read from the map data written in the initial value setting step S12.

Next, in a die bonding step S14, the dies are picked up from the starting position read in the step S13 to execute the die bonding.

Ina die presence/absence confirmation step S15, it is confirmed whether or not the dies are present in the set wafer. If the dies are present, the flow is moved to the process of a die bonding completion confirmation step S16. If not, the flow is moved to the process of the wafer setting step S11.

In the die bonding completion confirmation step S16, it is confirmed whether or not the die bonding has been executed for the all substrates. In the case where the die bonding has not been executed for the all substrates, the flow is moved to the process of the die bonding step S14. In the case where the die bonding has been executed for the all substrates, the die bonding is completed.

In the case of using such a collet, it is necessary for the collet to absorb the die. Thus, in the case where foreign substances such as metal, resin, or dust generated in, for example, a dicing process are attached into a gap between the die and the tip end (absorption surface) of the collet, there is a possibility that elements or protective films of the dies are damaged, or wirings are disconnected.

Therefore, an operator regularly and frequently dismounts the collet from the apparatus for replacement or cleaning. Thus, it is necessary to stop the die bonder every time the collet is cleaned, leading to reduction in the operating rate of the apparatus.

Accordingly, for example, Japanese Patent Application Laid-Open No. H6-302630 describes an apparatus in which a die is absorbed at the tip end of a collet to be mounted on a lead frame. During the process, when foreign substances attached to the tip end of the collet are removed for die bonding, the tip end of the collet is imaged by a camera such as an ITV to determine the presence of absence of foreign substances. As a result, the collet is heated or cleaned, and then the air is blown to remove the foreign substances.

There has been used a method from the past in which the foreign substances are blown off by air blowing as described in, for example, Japanese Patent Application Laid-Open No. H6-302630, or the foreign substances are removed by a metal brush. Therefore, it has been necessary to add a unit such as an air blowing mechanism or a brushing mechanism.

Further, it has been impossible to remove the foreign substances with high adhesive power by air blowing or brushing.

Further, even if the foreign substances can be removed, there has been a risk that the removed foreign substances scatter to be attached to the product.

In view of the above-described problems, an object of the present invention is to provide a collet cleaning method and a die bonder using the same in which a collet can be cleaned without adding a new unit, and foreign substances with high adhesive power can be reliably removed without scattering the foreign substances.

SUMMARY OF THE INVENTION

In order to achieve the above-described object, according to a first aspect of the present invention, provided is a collet cleaning method including: a wafer setting step of setting a wafer held by a dicing tape in a wafer ring; an initializing step of executing initialization of a die bonder, writing of map data for dies of the set wafer, and writing of an implementation program; a die starting position reading step of reading a starting position at which a collet starts to pick up the dies; a collet cleaning position determination step of reading a predetermined position of the dicing tape at which no dies exist using the die starting position as a reference point; a moving step of moving the collet to the predetermined position; a collet cleaning step of closely attaching the collet to the predetermined position of the dicing tape; and a die bonding step of executing die bonding by picking up the die from the die starting position, wherein foreign substances attached to the tip end of the collet are removed at the predetermined position.

According to a second aspect of the present invention, the predetermined position at which the foreign substances are removed is a margin of a position of the dicing tape where the wafer is held in the collet cleaning method according to the first aspect of the present invention.

According to a third aspect of the present invention, the collet cleaning step of removing the foreign substances is performed, at least, before the wafer ring holding the wafer is supplied to a pickup device to start to pick up the dies in the collet cleaning method according to the first or second aspect of the present invention.

In order to achieve the above-described object, according to a fourth aspect of the present invention, provided is a die bonder including: a wafer supplying unit that has a pickup device to pick up dies from a wafer and holds the wafer; a bonding head unit that allows a collet to absorb the dies from the wafer to be bonded onto a substrate; a bonding head unit that picks up the dies from a passing stage on which the substrate is absorbed by the collet to be bonded onto the substrate; a work supplying/carrying unit that carries the substrate; and a control unit that controls the wafer supplying unit, the bonding head unit, and the work supplying/carrying unit, wherein the control unit moves the collet to a position of the dicing tape at which no dies of the wafer held by a wafer ring exist to be brought into contact with the adhesive surface of the dicing tape, so that foreign substances attached to the tip end of the collet are removed.

According to a fifth aspect of the present invention, the position at which the foreign substances are removed is a margin of a position of the dicing tape to which the wafer adheres in the die bonder according to the fourth aspect of the present invention.

According to a sixth aspect of the present invention, the timing of removing the foreign substances is, at least, before the wafer ring holding the wafer is supplied to the pickup device to start to pick up the dies in the die bonder according to the fourth or fifth aspect of the present invention.

According to the present invention, it is possible to provide a collet cleaning method and a die bonder using the same in which a collet can be cleaned without adding a new unit, and foreign substances with high adhesive power can be reliably removed without scattering the foreign substances.

DETAILED DESCRIPTION OF THE INVENTION

Figure 1:
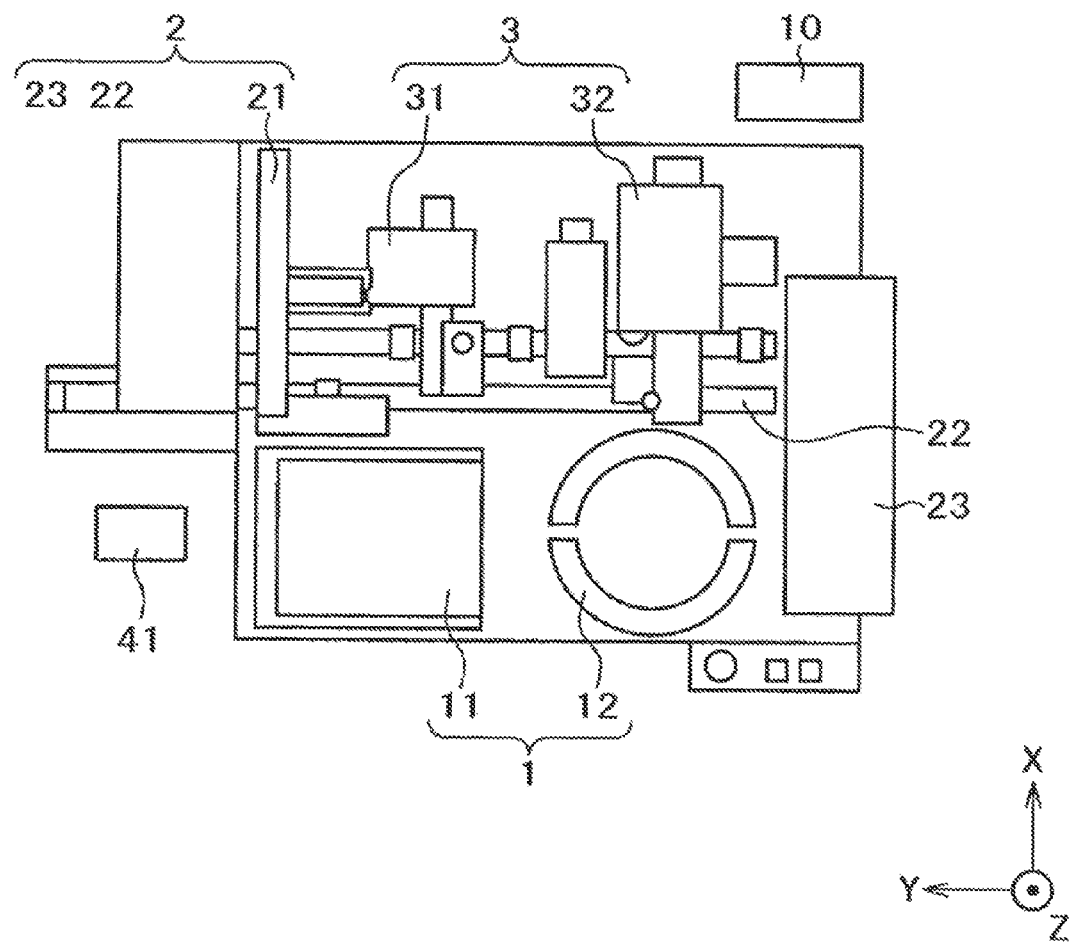
FIG. 1 is a conceptual diagram of a die bonder according to an embodiment of the present invention viewed from the above.

Hereinafter, an embodiment of the present invention will be described using the drawings and the like.

It should be noted that the following explanation is to explain the embodiment of the present invention, and does not limit the scope of the invention of the present application. Thus, other embodiments in which the respective or all constitutional elements of the embodiment are replaced by equivalents can be employed by those skilled in the art, and these embodiments fall within the scope of the invention of the present application.

In addition, the same reference numerals are given to constitutional elements having the same functions in the explanation for each drawing, and the explanation will be omitted as much as possible to avoid duplication.

An embodiment of a die bonder of the present invention will be described using FIG. 1. FIG. 1 is a conceptual diagram of an embodiment of a die bonder of the present invention viewed from the above. The reference numeral 100 denotes a die bonder; 1, a wafer supplying unit; 2, a work supplying/carrying unit; 3, a die bonding unit; and 10, a control unit that controls operations of the die bonder.

The die bonder roughly includes the wafer supplying unit 1, the work supplying/carrying unit 2, and the die bonding unit 3.

Further, in the work supplying/carrying unit 2, the reference numeral 21 denotes a stack loader; 22, a frame feeder; and 23, an unloader. Furthermore, in the die bonding unit 3, the reference numerals 31 and 32 denote a substrate check unit and a bonding head unit, respectively. Furthermore, in the wafer supplying unit 1, the reference numerals 11 and 12 denote a wafer cassette lifter and a pickup device, respectively.

In addition, the reference numeral 10 denotes the control unit that mutually accesses each device of the die bonder 100 to control each device in accordance with a predetermined program. It should be noted that signal lines through which the control unit mutually accesses each device are omitted in FIG. 1.

The work supplying/carrying unit 2 performs a substrate carrying process in a die bonding process. In the work supplying/carrying unit 2, a substrate P (not shown) is supplied to the frame feeder 22 by the stack loader 21. The substrate P fed to the frame feeder 22 is carried to the unloader 23 through two processing positions on the frame feeder 22.

In addition, the die bonding unit 3 performs a die attachment process in the die bonding process. In the die bonding unit 3, the substrate check unit 31 allows an imaging device C2 (not shown) to image the substrate P carried by the frame feeder 22, and transmits the image data to the control unit 10. The control unit 10 calculates the amount of misalignment between the original point of the die bonder 100 and the reference point on the carried substrate P in an image process. The amount of correction at the time of bonding is calculated on the basis of the calculated amount of misalignment.

The bonding head unit 32 picks up a die 4 (see FIG. 2 or FIG. 3) from a passing stage 444 (see FIGS. 4A, 4B and 4C) of the pickup device 12, and raises and moves the picked-up die 4 in parallel to the bonding point on the frame feeder 22. Then, the bonding head unit 32 moves the die 4 downward to be bonded on the substrate P. In this case, the control unit 10 performs the bonding while correcting the position to which the die 4 is attached using the amount of correction by the image obtained by the substrate check unit 31.

In addition, the wafer supplying unit 1 performs a peeling process in the die bonding process. In the wafer supplying unit 1, the wafer cassette lifter 11 has a wafer cassette (not shown) in which wafer rings are accommodated, and sequentially supplies the wafer rings to the pickup device 12. The detailed configuration and operation of the pickup device 12 will be described later using FIG. 2 and FIG. 3.

Figure 2:
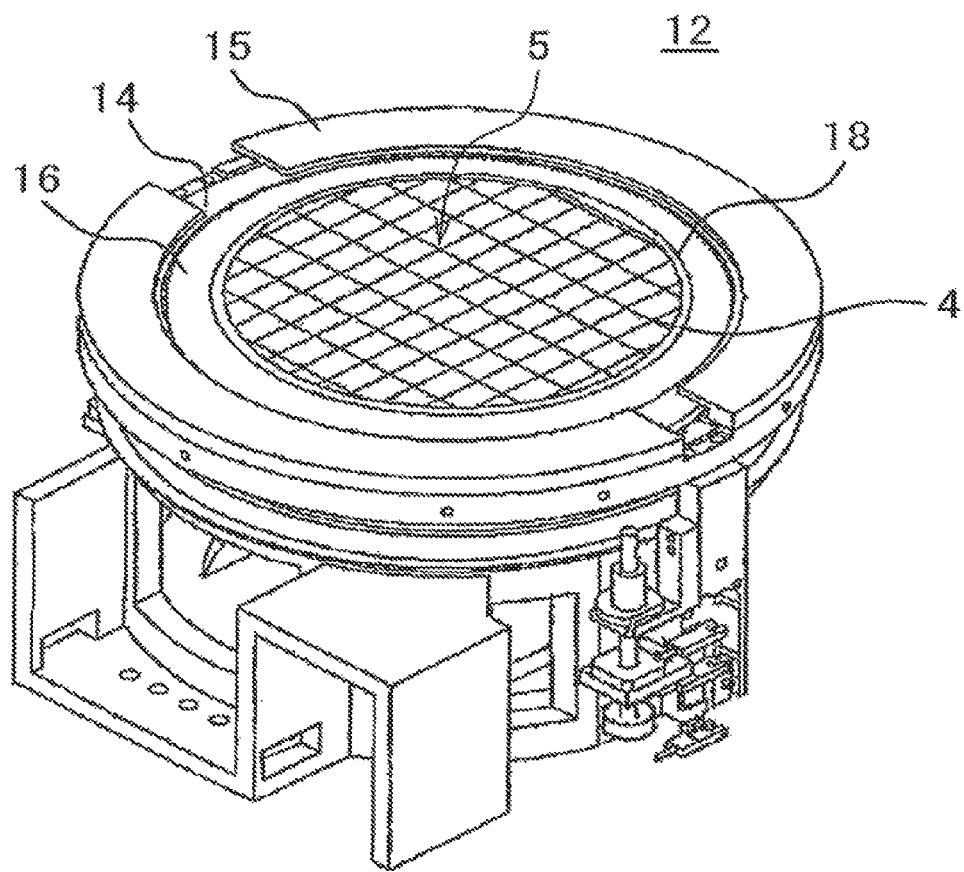
FIG. 2 is an external perspective view of a pickup device according to the embodiment of the present invention.
Figure 3:
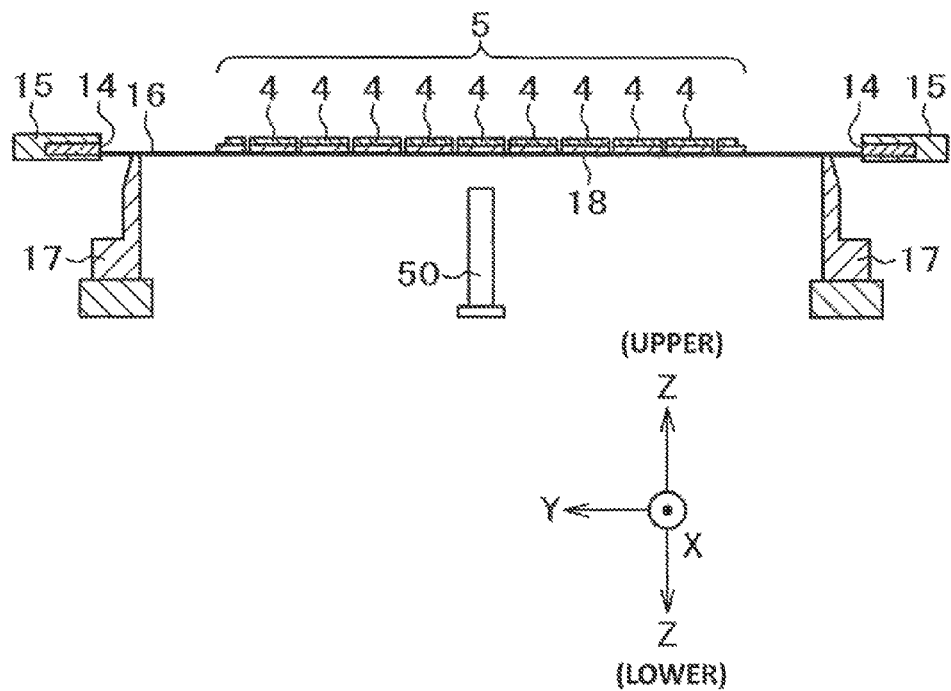
FIG. 3 is an outline cross-sectional view for showing main parts of the pickup device according to the embodiment of the present invention.

The configuration of the pickup device 12 will be described using FIG. 2 and FIG. 3. FIG. 2 is an external perspective view of the pickup device 12. FIG. 3 is an outline cross-sectional view for showing main parts of the pickup device 12. In the pickup device 12, the reference numeral 5 denotes a wafer; 4, dies each of which is possessed by the wafer 5; 14, a wafer ring; 15, an expanding ring; 16, a dicing tape; 17, a support ring; 18, a die attachment film (die bonding tape); and 50, a lifting unit.

As shown in FIG. 2 and FIG. 3, the die attachment film 18 is attached to the rear surface (lower surface) of the wafer 5, and further the dicing tape 16 is attached to the rear surface (lower surface) of the die attachment film 18. Further, the margin of the dicing tape 16 is sandwiched and fixed between the wafer ring 14 and the expanding ring 15. It should be noted that in the case where the die bonder is provided with a pre-form unit and adhesive is applied to the substrate in advance, the die attachment film 18 is not needed, and the dicing tape 16 is directly attached to the rear surface of the wafer 5 to hold the wafer 5.

Specifically, the pickup device 12 has the expanding ring 15 that holds the wafer ring 14, the support ring 17 that horizontally positions the dicing tape 16 adhering to the wafer 5 (plural dies 4) held by the wafer ring 14, and a lifting unit 50 that lifts upward the dies 4 disposed inside the support ring 17.

The lifting unit 50 is moved in the upper and lower directions by a driving mechanism (not shown). When the lifting unit 50 is moved to the die 4 to be picked up for positioning, for example, the wafer ring 14 is moved in the horizontal (X) direction, and the lifting unit 50 is moved in the depth (Y) direction. However, it is obvious that any one of them may be relatively moved. In addition, the same is true in the case of movement for positioning between a collet 6 (to be described later) and the die 4 to be picked up.

Recently, adhesive for die bonding of the liquid type has been replaced by that of the film type, and a film-like adhesive material called as the die attachment film 18 is attached between the wafer 5 and the dicing tape 16. For the wafer 5 having the die attachment film 18 on the rear surface, the wafer 5 and the die attachment film 18 are diced. It should be noted that there has been recently a tape obtained by unifying the dicing tape 16 and the die attachment film 18. In this case, too, the wafer 5 and the die attachment film 18 are diced.

The pickup device 12 allows the lifting unit 50 to lift the die 4 at the timing of lifting, and allows the expanding ring 15 holding the wafer ring 14 to be moved downward. In this case, the support ring 17 is not moved downward. Thus, the dicing tape 16 held by the wafer ring 14 is stretched, so that the gaps between the dies 4 are widened, and each die 4 can be easily recognized. In addition, the die to be picked up is separated, and can be easily lifted.

The lifting unit 50 lifts the die 4 from the lower side. As a result, the die 4 can be easily picked up by the collet (absorption nozzle) 6. For the wafer 5 having the die attachment film 18, the wafer 5 and the die attachment film 18 are diced. Thus, in a peeling (lifting) process, the die 4 and the die attachment film 18 are peeled from the dicing tape 16, and the collet 6 absorbs and picks up the die 4.

Figure 4A:
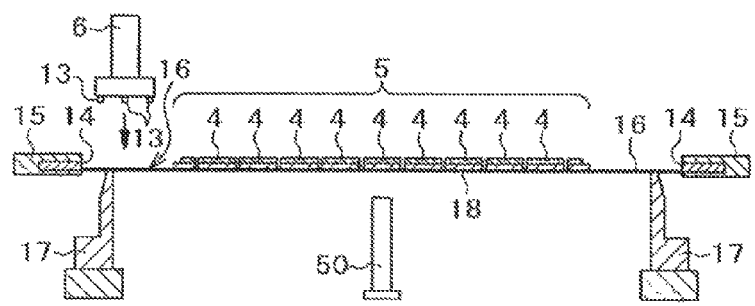
FIGS. 4A, 4B and 4C are diagrams each explaining an embodiment of a collet cleaning operation in the die bonder of the present invention using the outline cross-sectional view for showing main parts of the pickup device of FIG. 3.
Figure 4B:
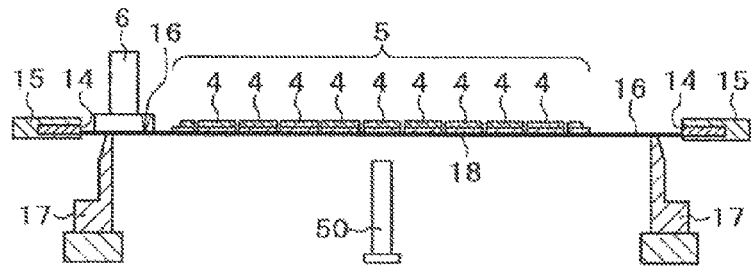
Figure 4C:
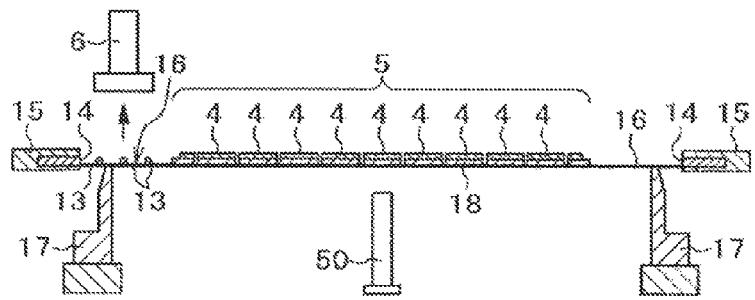

FIGS. 4A, 4B and 4C are diagrams each explaining an embodiment of a collet cleaning operation in the die bonder 100 of the present invention using the outline cross-sectional view for showing main parts of the pickup device 12 of FIG. 3.

In FIG. 4A, the collet 6 at the tip end of which foreign substances 13 are attached is moved on the XY plane to the position (margin) of the dicing tape 16 where no dies 4 exist before the collet 6 picks up the die 4 from the wafer 5, and then is moved downward in the vertical direction (along the Z-axis). It is preferable that if the collet 6 is moved on the XY plane while being moved downward to the position of the dicing tape 16 where no dies 4 exist, the processing time can be reduced.

After the collet 6 is moved downward to reach the surface of the dicing tape 16, the collet 6 is further moved downward a predetermined distance for a predetermined period of time. As shown in FIG. 4B, the foreign substances 13 attached to the tip end of the collet 6 are brought into contact with the adhesive surface of the dicing tape 16. Thus, the foreign substances 13 adhere to the surface of the dicing tape 16.

Next, if the collet 6 is moved upward again as shown in FIG. 4C, the foreign substances 13 at the tip end of the collet 6 are removed. It is preferable that if the collet 6 is moved on the XY plane while being moved upward to the position where the die 4 is picked up, the processing time can be reduced.

It should be noted that the driving system that moves the collet 6 on the XY plane is realized in such a manner that the side of the wafer 5 or the side of the bonding head in which the collet 6 is mounted is moved, or the both are relatively moved.

Figure 5A:
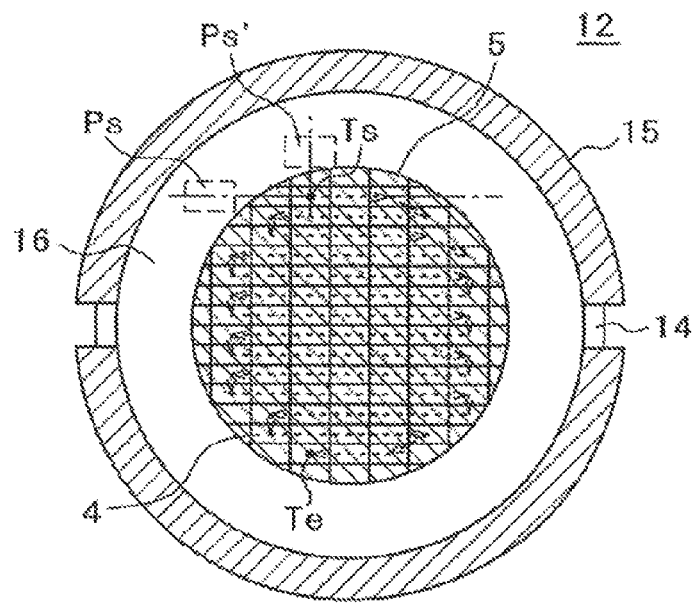
FIGS. 5A and 5B are plan views each showing an embodiment of a position on the surface of a dicing tape on which a collet is moved downward to remove foreign substances in the collet cleaning operation of the present invention.
Figure 5B:
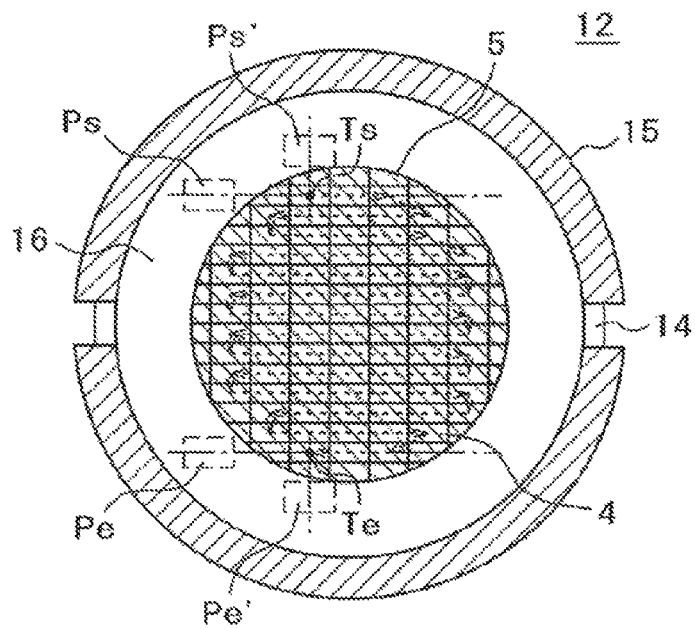

FIGS. 5A and 5B are plan views each showing an embodiment of a position on the surface of the dicing tape 16 on which the collet 6 is moved downward to remove the foreign substances in the collet cleaning operation explained using FIGS. 4A, 4B and 4C.

As shown in FIG. 5A, in the case where the dies 4 of the wafer 5 are sequentially picked up in accordance with the dashed arrows from a starting position Ts to an ending position Te, the collet 6 is moved downward to a position Ps of the dicing tape 16 that is near the starting position Ts in the moving distance of the X-direction, so that the collet cleaning is performed. Alternatively, the collet 6 is moved downward to a position Ps' of the dicing tape 16 that is near the starting position Ts in the moving distance of the Y-direction, so that the collet cleaning is performed.

Next, in FIG. 5B, the collet cleaning is performed at a position Pe or Pe' even in the ending position Te in addition to FIG. 5A in which in the case where the dies 4 are picked up from the starting position Ts to the ending position Te, the collet cleaning is performed at the position Ps or Ps' before the dies 4 are picked up from the starting position Ts. In this case, too, the collet 6 is moved downward to the position Pe of the dicing tape 16 that is near the ending position Te in the moving distance of the X-direction or the collet 6 is moved downward to the position Pe' of the dicing tape 16 that is near the ending position Te in the moving distance of the Y-direction, so that the collet cleaning is performed.

Figure 6A:
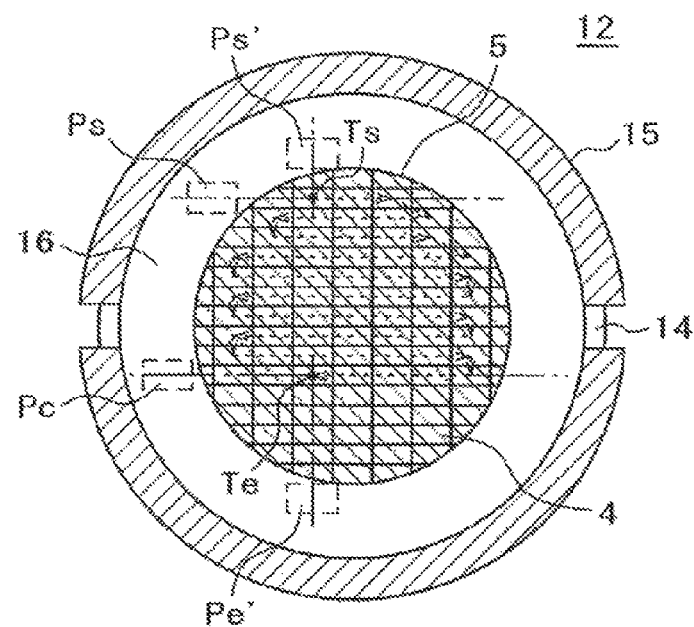
FIGS. 6A and 6B are plan views each showing an embodiment of a position on the surface of the dicing tape on which the collet is moved downward to remove the foreign substances in the collet cleaning operation of the present invention.
Figure 6B:
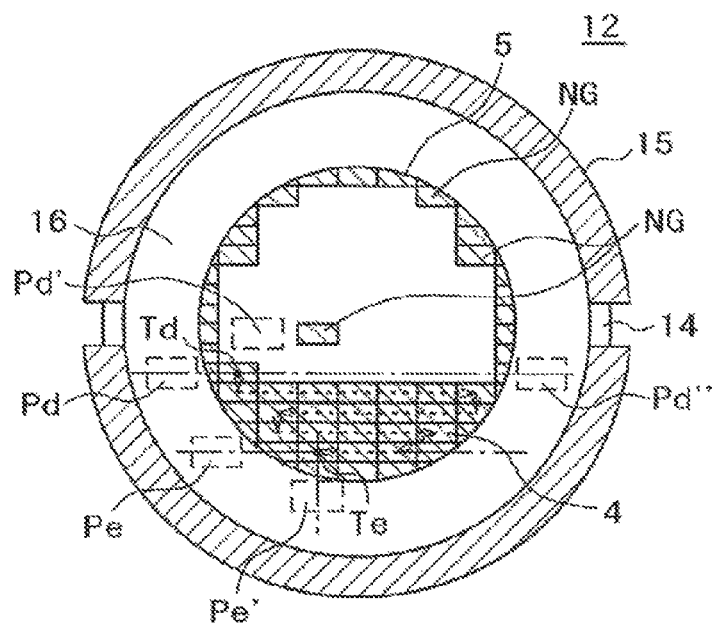

FIGS. 6A and 6B are plan views each showing an embodiment of a position on the surface of the dicing tape 16 on which the collet 6 is moved downward to remove the foreign substances in the collet cleaning operation explained using FIGS. 4A, 4B and 4C, and are also application examples of FIGS. 5A and 5B.

FIG. 6A shows a case in which, as similar to FIG. 5A, the dies 4 of the wafer 5 are sequentially picked up in accordance with the dashed arrows from the starting position Ts to a position Tc in the middle. In this case, too, the collet 6 is moved downward to the position Ps of the dicing tape 16 that is near the starting position Ts in the moving distance of the X-direction or the collet 6 is moved downward to the position Ps' of the dicing tape 16 that is near the starting position Ts in the moving distance of the Y-direction, so that the collet cleaning is performed, as similar to FIG. 5A.

Next, as shown in FIG. 6A, in the case where the dies 4 of the wafer 5 are sequentially picked up in accordance with the dashed arrows from the starting position Ts to the position Tc in the middle, the collet 6 is moved downward to the dicing tape 16 to perform the collet cleaning before starting to pick up the dies 4 from the starting position Ts, as similar to FIG. 5A. In addition thereto, the collet cleaning is performed at a position Pc or Pc' even in the ending position Tc. In this case, too, the collet 6 is moved downward to the position Pc of the dicing tape 16 that is near the ending position Tc in the moving distance of the X-direction or the collet 6 is moved downward to the position Pc' of the dicing tape 16 that is near the ending position Tc in the moving distance of the Y-direction, so that the collet cleaning is performed.

As shown in FIG. 6A, it is conceivable that the dies are picked up later or at a later date from the wafer 5 in which some dies 4 have been already picked up. In this case, the dies are started to be picked up from a position Td of the die following the position Tc of the die at which the pickup was finished last time. In this case, too, the collet 6 is moved downward to a position Pd of the dicing tape 16 that is near the starting position Td in the moving distance of the X-direction, so that the collet cleaning is performed. Alternatively, the collet 6 is moved downward to a position Pd' of the dicing tape 16 that is near the starting position Td in the moving distance of the Y-direction, so that the collet cleaning is performed.

Next, in FIG. 6A, the collet cleaning is performed at the position Pe or Pe' even in the ending position Te in addition to FIG. 5A in which in the case where the dies 4 are picked up from the starting position Ts to the ending position Te, the collet cleaning is performed at the position Ps or Ps' before the dies 4 are picked up from the starting position Ts. In this case, too, the collet 6 is moved downward to the position Pe of the dicing tape 16 that is near the ending position Te in the moving distance of the X-direction or the collet 6 is moved downward to the position Pe' of the dicing tape 16 that is near the ending position Te in the moving distance of the Y-direction, so that the collet cleaning is performed.

Further, it is conceivable in FIG. 6B that the position of the dicing tape 16 at which the collet cleaning is performed before the dies are picked up in the starting position Pd is the same as the position Pc at which the pickup of the dies was finished last time. In this case, there is a high possibility that foreign substances are attached to the position of the dicing tape 16. Thus, it is preferable to perform the collet cleaning at a different position.

For example, the position Pd' is a part of the dicing tape 16 after the dies are picked up. In addition, for example, a position Pd" located at the margin of the dicing tape 16 to which the wafer 5 adheres is the position on the surface of the dicing tape 16 opposite in the X-direction to the position Pd of the starting position Td at which the dies are picked up. As described above, the position of the collet cleaning may be arbitrarily set in accordance with the conditions.

It should be noted that a die NG is a die left without being picked up because it was a defective in characteristics on the map data in the previous die pickup operation.

Figure 7:
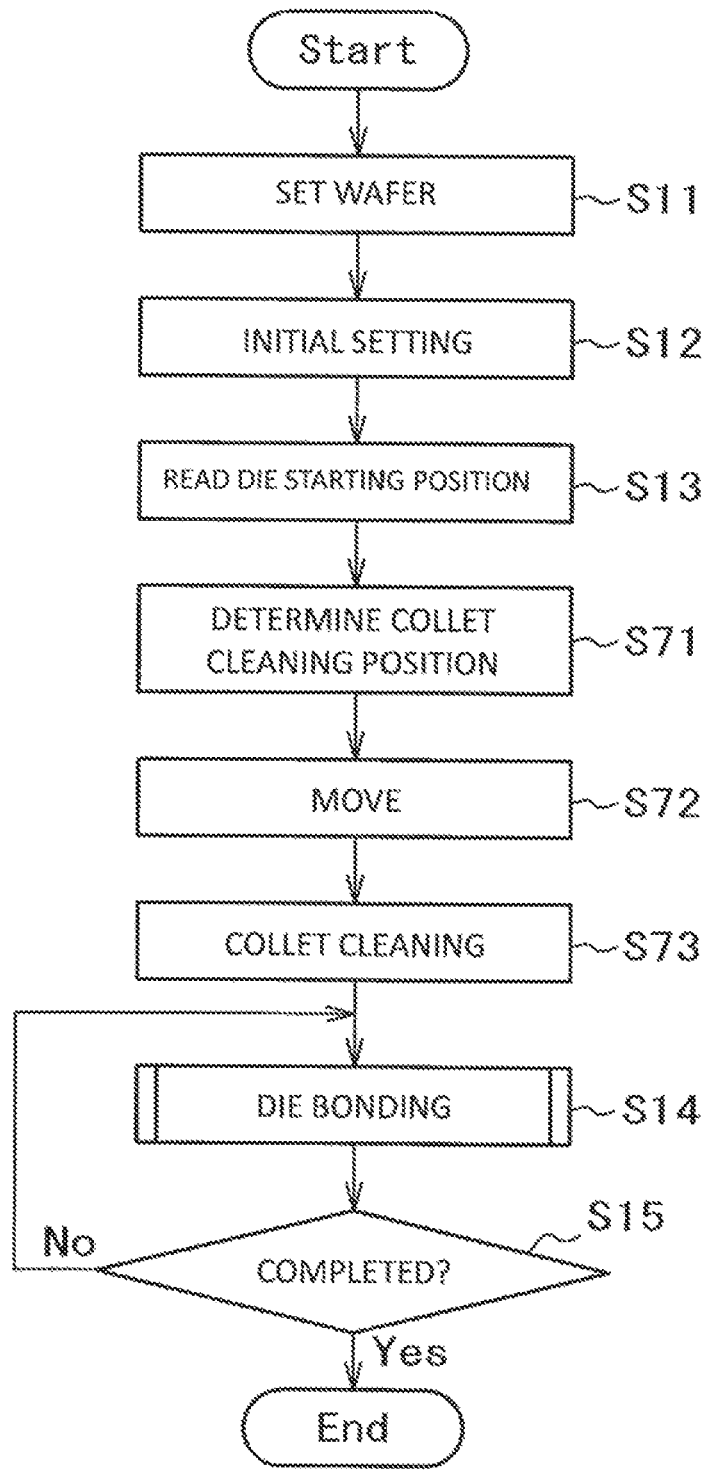
FIG. 7 is a flowchart for explaining an embodiment of a procedure of the collet cleaning operation by the die bonder of the present invention.

An embodiment of a procedure of the collet cleaning operation by the die bonder of the present invention will be described using FIG. 7. FIG. 7 is a flowchart for explaining an embodiment of a procedure of the collet cleaning operation by the die bonder of the present invention. This operation is controlled in such a manner that the control unit 10 of the die bonder 100 mutually accesses the respective devices of the die bonder 100.

Figure 9:
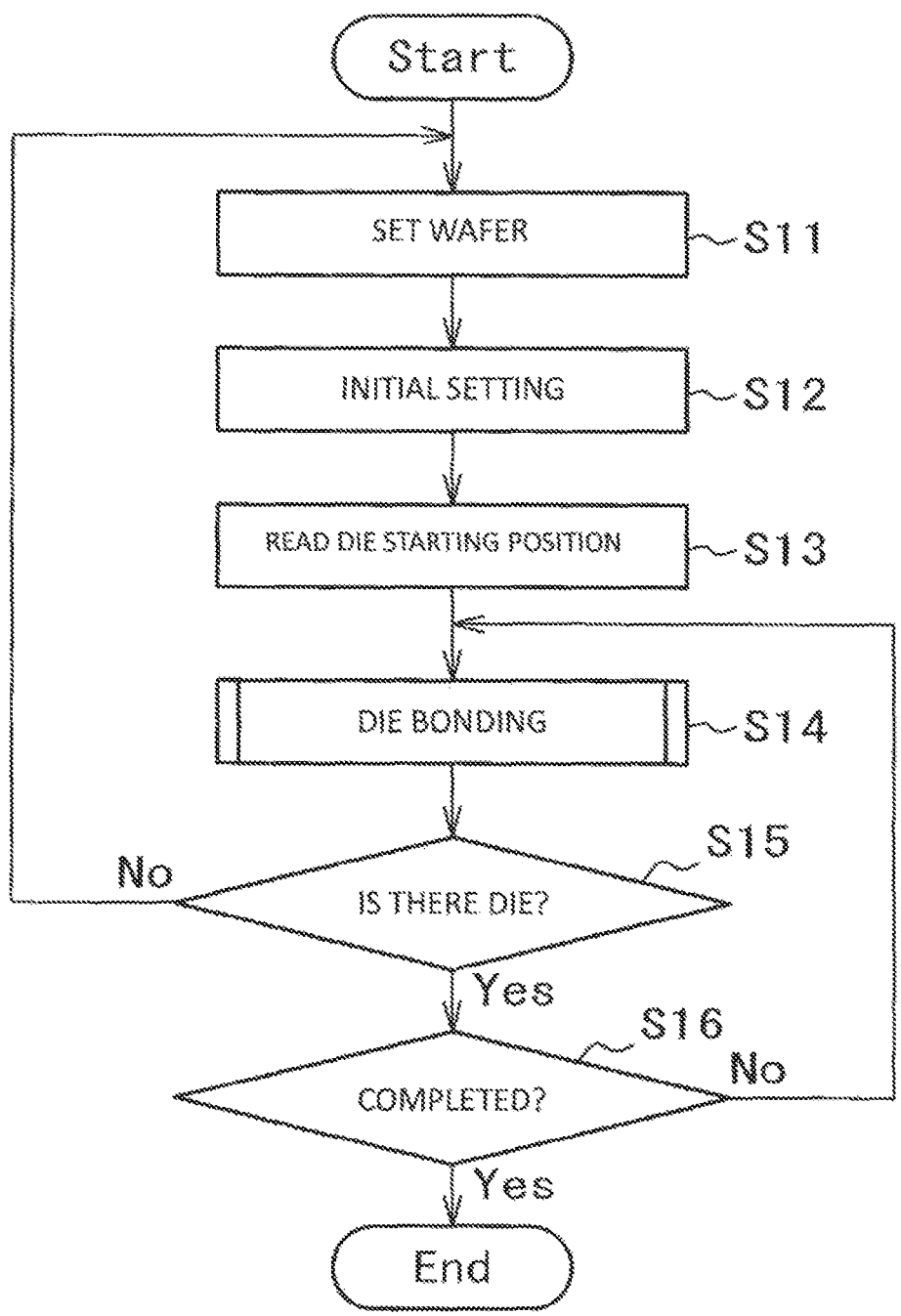
FIG. 9 is a flowchart for explaining an embodiment of a procedure of the collet cleaning operation by a conventional die bonder.

In the process operation of FIG. 7, the wafer setting step S11 to the die starting position reading step S13 are the same as described using FIG. 9. Thus, the explanations thereof will not be repeated. It should be noted that the implementation program of the present invention includes the collet cleaning operation. However, the implementation program that is written in the initial value setting step S12 of FIG. 9 does not include the same.

In the die starting position reading step S13, the position (starting position: see the position Ts and the position Td of FIGS. 5A and 5B) from which the dies are started to be picked up is read from the map data written in the initial value setting step S12.

Next, in a collet cleaning position determination step S71, the position Ps (see FIG. 5A) of the dicing tape 16 is read using the starting position read in the die starting position reading step S13 as a reference point.

Next, in a moving step S72, the collet 6 is moved to the collet cleaning position Ps.

Next, in a collet cleaning step S73, the collet 6 is moved downward to a predetermined height, so that the tip end of the collet 6 is closely attached to the dicing tape 16, and then is moved upward to a predetermined height.

Hereinafter, the processes of the die bonding step S14 to the die bonding completion confirmation step S16 are executed as described in FIG. 9.

As a result, the foreign substances at the tip end of the collet can be removed before the die bonding of one wafer is started.

Figure 8:
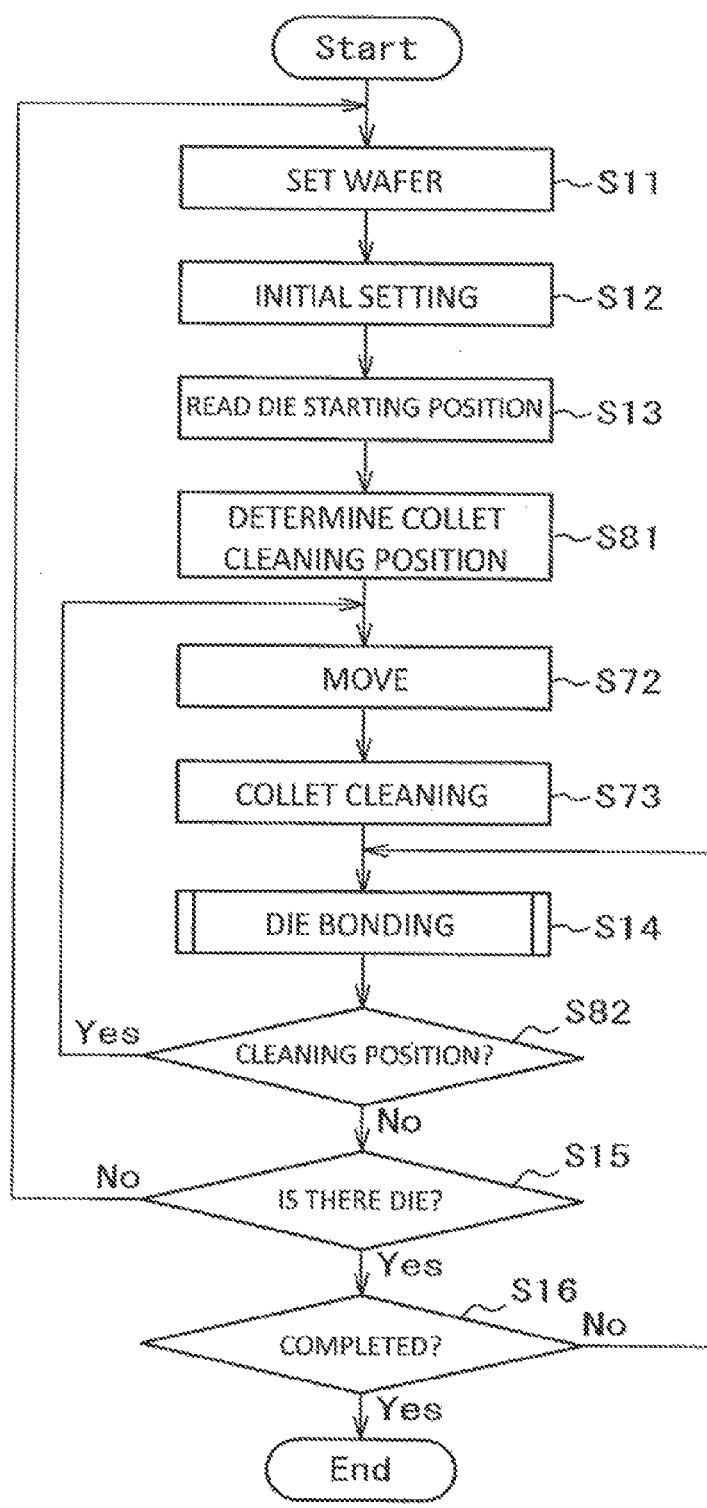
FIG. 8 is a flowchart for explaining an embodiment of a procedure of the collet cleaning operation by the die bonder of the present invention.

An embodiment of a procedure of the collet cleaning operation by the die bonder of the present invention will be described using FIG. 8. FIG. 8 is a flowchart for explaining an embodiment of a procedure of the collet cleaning operation by the die bonder of the present invention. This operation is controlled in such a manner that the control unit 10 of the die bonder 100 mutually accesses the respective devices of the die bonder 100.

In the process operation of FIG. 8, the wafer setting step S11 to the die starting position reading step S13 are the same as described using FIG. 7. Thus, the explanations thereof will not be repeated.

Next, in a collet cleaning position determination step S81, plural positions of the dicing tape 16 are read using the starting position read in the die starting position reading step S13 as a reference point. For example, the positions of the collet cleaning at the time of starting and finishing the pickup are read (see FIG. 5B, FIG. 6A, or FIG. 6B).

Hereinafter, the moving step S72, the collet cleaning step S73, and the die bonding step S14 are the same as those explained in FIG. 7 or FIG. 9.

Next, in a cleaning position confirmation step S82, it is confirmed whether or not it is time to execute the collet cleaning right after the die bonding of one die 4 on the wafer 5 is performed. In the case where it is time to execute the collet cleaning, the flow is moved to the process of the moving step S72, and the collet cleaning is executed at a predetermined position on the dicing tape 16 (Steps S72 and S73). Then, the die bonding is performed (Step S14).

In the embodiment shown in FIG. 5B, FIG. 6A, or FIG. 6B, the collet cleaning is executed at a predetermined position of the dicing tape 16 after the die bonding of the last die is performed.

In the case where it is not time to execute the collet cleaning, the flow is moved to the process of the die presence/absence confirmation step S15. Hereinafter, the process operations of the die presence/absence confirmation step S15 and the die bonding completion confirmation step S16 are the same as those explained in FIG. 7 or FIG. 9.

According to the above-described embodiment, the collet cleaning is automatically executed at a predetermined position or timing, and thus parts of the collet 6 at which the die 4 is absorbed can be kept clean. Further, the dicing tape is originally used to attach the die (wafer), and is a material less in staining properties to the die. Thus, the impact of staining at the time of removing the foreign substances is smaller as compared to air blowing. As a result, it is not necessary to interrupt the die bonding operation to remove the foreign substances of the collet, thus leading to reduction of the length of the process and improvement in the quality of the product.

It should be noted that the position or timing at which the collet cleaning is automatically executed is not limited to the time of starting or finishing the die bonding. For example, the collet cleaning may be automatically executed every time the row of the dies on the wafer is changed or every two rows. In addition, an operator may execute the collet cleaning by operating the die bonder as needed.

What is claimed is:

1. A collet cleaning method comprising:
    a wafer setting step of setting a wafer held by a dicing tape in a wafer ring;
    an initializing step of executing initialization of a die bonder, writing of map data for dies of the set wafer, and writing of an implementation program;
    a die starting position reading step of reading a starting position at which a collet starts to pick up the dies;
    a collet cleaning position determination step of reading a predetermined position on the dicing tape at which no dies exist using the die starting position as a reference point;
    a moving step of moving the collet to the predetermined position;
    a collet cleaning step of closely attaching the collet to the predetermined position on the dicing tape; and
    a die bonding step of executing die bonding by picking up the die from the die starting position, wherein
    the predetermined position is a position between the wafer and the wafer ring in plan view, and a margin of a position of the dicing tape where the wafer is held, and
    foreign substances attached to the tip end of the collet are removed at the predetermined position.

2. The collet cleaning method according to claim 1, wherein the collet cleaning step is performed, at least, before the wafer ring holding the wafer is supplied to a pickup device to start to pick up the dies.

3. The collet cleaning method according to claim 1, wherein the wafer has dies arranged along X-direction and Y-direction, and the predetermined position is a position of the X-direction or the Y-direction from the die starting position.

4. The collet cleaning method according to claim 3, wherein the predetermined position is a position of the dicing tape that is near the die starting position in moving distance of the X-direction or a position of the dicing tape that is near the die starting position in moving distance of the Y-direction.

5. The collet cleaning method according to claim 3, wherein if a position at which the foreign substances are removed on the dicing tape is the same position as previous collet cleaning, the predetermined position is a position of the dicing tape that is opposite side of the predetermined position of the previous collet cleaning against the starting position.

* * * * *